United States Patent [19]

Nishi

[11] Patent Number: 4,962,318
[45] Date of Patent: Oct. 9, 1990

[54] ALIGNMENT SYSTEM FOR EXPOSURE APPARATUS

[75] Inventor: Kenji Nishi, Kawasaki, Japan

[73] Assignee: Nikon Corporation, Tokyo, Japan

[21] Appl. No.: 395,078

[22] Filed: Aug. 17, 1989

[30] Foreign Application Priority Data

Aug. 19, 1988 [JP] Japan ................... 63-205770

[51] Int. Cl.⁵ ............................................. G01N 21/86
[52] U.S. Cl. ..................................... 250/548; 356/401
[58] Field of Search ....................... 250/548, 557, 561; 356/399–401, 141, 152

[56] References Cited

U.S. PATENT DOCUMENTS

| 4,385,838 | 5/1983 | Nakazawa et al. | 356/399 |
| 4,402,596 | 9/1983 | Kanatani | 355/43 |
| 4,566,795 | 1/1986 | Matsurra et al. | 356/400 |
| 4,655,598 | 4/1987 | Murakami et al. | 356/400 |
| 4,677,301 | 6/1987 | Tanimoto et al. | 250/548 |
| 4,780,617 | 10/1988 | Umatate et al. | 250/548 |
| 4,798,962 | 1/1989 | Matsumoto et al. | 356/401 |

Primary Examiner—David C. Nelms
Assistant Examiner—K. Shami
Attorney, Agent, or Firm—Shapiro and Shapiro

[57] ABSTRACT

An exposure apparatus for transferring a mask pattern to a wafer having a surface photoresist layer. The apparatus is comprised of first and second detectors and a determination unit. The first detector includes a light-emitting system for generating first light to illuminate first marks on the substrate and provides first position data. The second mark position detector includes a light-emitting system for generating second light having a wider wavelength distribution than that of the first light to illuminate second marks on the substrate and provides second position data. Determination unit (EGA operational unit 502 or the like) is provided for determining the position of the substrate as a whole by using both of the first and second position data.

4 Claims, 7 Drawing Sheets

ALIGNMENT SYSTEM FOR EXPOSURE APPARATUS

BACKGROUND OF THE INVENTION

1. Field of the Invention

This invention relates to an alignment system for aligning a substrate to be exposed in an exposure apparatus used for the manufacture of semiconductor elements, liquid crystal elements, etc., particularly an exposure apparatus of step-and-repeat or step-and-scan type.

2. Related Background Art

In an exposure apparatus of this type, circuit patterns called masks or reticles, drawn on a master plate, are fixed on a photoresist layer of a semiconductor wafer and are developed to obtain desired photoresist patterns.

In general manufacture of semiconductor elements, several to several ten layers of circuit patterns are laminated. Therefore, it is necessary to accurately align an optical image of a circuit pattern, to which exposure is to be made, to circuit patterns already formed on a wafer. Various devices that are necessary for this alignment or matching are called positioning or alignment system. The alignment system is essential for an exposure apparatus, in which exposure under alignment as noted above is performed, and recently it is improved to be capable of highly accurate and high speed processing. The alignment system may roughly consist of three elementary techniques. One of these techniques is an optical system for alignment, which optically detects alignment marks formed on a wafer in advance and produces a photoelectric signal corresponding to an arrangement pattern of the marks. Another technique is a signal processing system, which electrically processes the photoelectric signal with an adequate algorithm to obtain a deviation from the regular position of the alignment marks. The last technique is an aligning mechanism for accurately correcting the position of the water or positions of masks or reticles according to the determined deviation.

Recently, extensive use has become made in plants dealing with semiconductor of a contracting exposure system (or also called stepper), which is an organic and high technical level combination of the above three elementary techniques, i.e., optical system for alignment as optical technique, signal processing system as electronic technique (or data processing technique) and positioning mechanism as precision machine technique. In the contracting exposure system, a light image of a circuit pattern of reticles is focused on an area (called shot area) of wafer through a high resolution projecting lens (with an aperture number of 0.35 to 0.5). The exposure shot of each cycle is or the order of 15 mm by 15 mm, and a stage with a wafer set thereon is stepped two-dimensionally in x- and y-axis directions to exposure the entire wafer surface. As practical form of optical system for alignment incorporated in the contracting exposure system, roughly there are three different systems. A first one of these optical systems is a TTR (through the reticle) system, in which alignment marks formed on a reticle and those on a wafer are simultaneously observed or detected through a projecting lens. A second optical system is a TTL (through the lens) system, in which no alignment mark on reticle is detected but sole alignment marks on wafer are detected. A third optical system is an off-axis system, in which sole alignment marks on wafer are detected through a microscopic objective lens provided separately and at a constant distance from a projecting lens.

In the TTR and TTL systems noted above, in which the wafer marks are detected through a projecting lens, light for illuminating the wafer marks is limited to a coherent laser beam (mono-wavelength) or g- or i-ray spectrum (psuedo-monochromatic) of a mercury lamp used for exposure. This is because the projecting lens is designed that its chromatic aberration with respect to exposure light (g- or i-rays) is best. Examples of the TTR system are disclosed in U.S. Pat. Nos. 4,566,795 and 4,402,596, and examples of the TTL system are disclosed in U.S. Pat. Nos. 4,677,301, 4,780,617 and 4,655,598.

Generally, with the TTR and TTL systems, which have resort to a projecting lens for wafer mark detection, marks belonging to a given shot area in a shot area array on a wafer can be detected comparatively freely by moving the wafer stage. In contrast, the off-axis system, in which marks (for instance two or three marks) belonging to only a predetermined shot area on wafer are detected usually due to a problem of a stroke of wafer stage movement. More specifically, it is possible, when the stroke of wafer stage movement is increased in this system, to permit detection of marks in a given shot area on wafer freely while permitting effective use of the advantage of the system in view of the illumination light of the optical system for alignment. However, a usual contracting exposure system uses a laser beam interference type instrument (called interferometer) for the measurement of the coordinate positions of the wafer stage. Therefore to increase the stroke of wafer stage movement dictates increasing size of a movable mirror (i.e., optical 又 ヨ 又 ) secured to wafer stage and hence the size of a wafer stage support base. Nevertheless, the advantage of the off-axis system, i.e., improvement of the mark detection accuracy obtainable with a free illumination arrangement, can not be ignored.

As shown above, the off-axis system can also detect marks belonging to a given shot area on wafer in case where the stroke of wafer stage movement is increased. In this case, however, a long time is required for mark detection depending on the arrangement and way of illumination of the optical system for alignment. In the off-axis system, the optical system for alignment is spaced apart from a pattern projection area of a photographing lens. This means that a corresponding extra distance has to be covered by the wafer stage. Therefore, a throughput reduction due to overall arrangement of the system is essentially inevitable. Considerations, therefore, are paid for ways, in which to reduce the mark detection time. The shortest mark detection time can be obtained by a system, in which marks on wafer are scanned by a slit-like converged spot of a laser beam for photoelectrically detecting scattered and diffracted light from mark edges as according to the prior-art references (1) to (5) and (7). This system is capable of mark detection with a practically sufficient signal-to-noise ratio owing to high brightness property of the laser beam. However, there is a significant problem in that a laser beam is usually a single wavelength beam. More specifically, thin film interference (multiple interference) or the like is produced due to a photoresist layers 1 to 5 microns thick covering the entire wafer surface. This phenomenon causes unexpected distortion of the light intensity distribution of the scattered and diffracted light from the mark edges (and hence unexpected waveform distortion of a corresponding photoelectric signal). The distribution of the light intensity distribution may not occur with any wafer and varies depending on the kind and thickness of the ground layer and photoresist layer of wafer. Further, usually distortion, if any, occurs in various ways. Therefore, no advantage over the prior art references (1) to (5) and (7) can be obtained by merely adopting a single-wavelength laser beam as noted above or psuedo monochromatic light (such as the wavelength spectrum of a mercury lamp) as mark illumination light (either spot light or uniform illumination light) of the optical system for alignment in the off-axis system. Rather, doing so merely leads to such disadvantage as a throughput reduction due to an extra stroke of wafer stage movement.

Accordingly, it is considered to have resort to light having a broad wavelength distribution in a bandwidth of about 200 nm as mark illumination light of the off-axis system. Doing so permits great reduction of adverse effects of the photoresist layer and improves the mark detection accuracy. That is, considerably high accuracy alignment can be expected by permitting detection of marks belonging to a plurality of given shot areas on wafer with wide band illumination light of the aligning optical system of the off-axis system.

However, as noted before it is not the case that distortion of the distribution of intensity of light from mark edges occurs with any wafer even in case of using single waveform or psuedo monochromatic light. In addition, even if there is slight distortion, its adverse effects can be alleviated with an adequate mark position detection algorithm. From these considerations, it is very illogical to substitute the aligning optical system of the off-axis system using wide band light for the whole mark detection for doing so inevitably leads to a throughput reduction even with wafers free from occurrence of distortion or wafers less subject to adverse effects of distortion.

SUMMARY OF THE INVENTION

The invention has an object of providing an alignment system, which permits high accuracy mark position detection while minimizing thoroughput reduction.

According to the invention, first and second mark position detection means are provided as alignment sensors for detecting alignment marks on a substrate through a photoresist layer.

The first mark position detection means includes a light-emitting system for generating single wavelength or psuedo monochromatic light as first light to illuminate first marks on the substrate and provides first position data (AP1, AP3, AP4, etc.) concerning positions of first marks.

The second mark position detection means includes a light-emitting system for generating light having a wider wavelength distribution than that of the first light as second light to illuminate second marks on the substrate and provides second position data (AP2) concerning positions of second marks.

The first and second marks may be in a common mark pattern on the substrate, or they may be in their respective exclusive patterns spaced apart by a predetermined distance.

Position determination means (EGA operational unit 502 or the like) is provided for determining the position of the substrate as a whole by using both of the first and second position data.

Thus, areas of substrate to be exposed and pattern areas of mask are aligned to one another.

The invention overcomes the drawback of using single wavelength or psuedo monochromatic light for detection of marks on a substrate of a wafer through a photoresist layer. The drawback is that the photoresist layer provides thin film interference to cause optical distortion of reflected light (i.e., scattered light, diffracted light and regularly reflected light) from the marks, thus causing subtle changes in the detected mark position. According to the invention, wide wavelength band illumination light which is less subject to adverse effects of the interference is used for mark detection. However, using an alignment sensor providing such wide wavelength band illumination light for the detection of all the marks on wafer, is generally disadvantageous in view of the throughput although the accuracy of mark detection is improved. Particularly, in a light-projecting exposure apparatus, it is impossible to use wide wavelength band illumination light for wafer mark detection through an optical system for light projection. This is so because there is a problem of chromatic aberration. Inevitably, an alignment sensor provided separately from the optical system for light projection (i.e., off-axis system) is used. The off-axis system alignment sensor dictates movement of wafer or the like for the mark detection, thus leading to corresponding throughput reduction. According to the invention, the second mark position detection means is used for detecting only some of a plurality of marks on wafer, thus minimizing the thoroughput reduction.

BRIEF DESCRIPTION OF THE DRAWINGS

FIG. 3 is a view showing a shot area map on a

DETAILED DESCRIPTION OF THE PREFERRED EMBODIMENTS

Figure 1A:
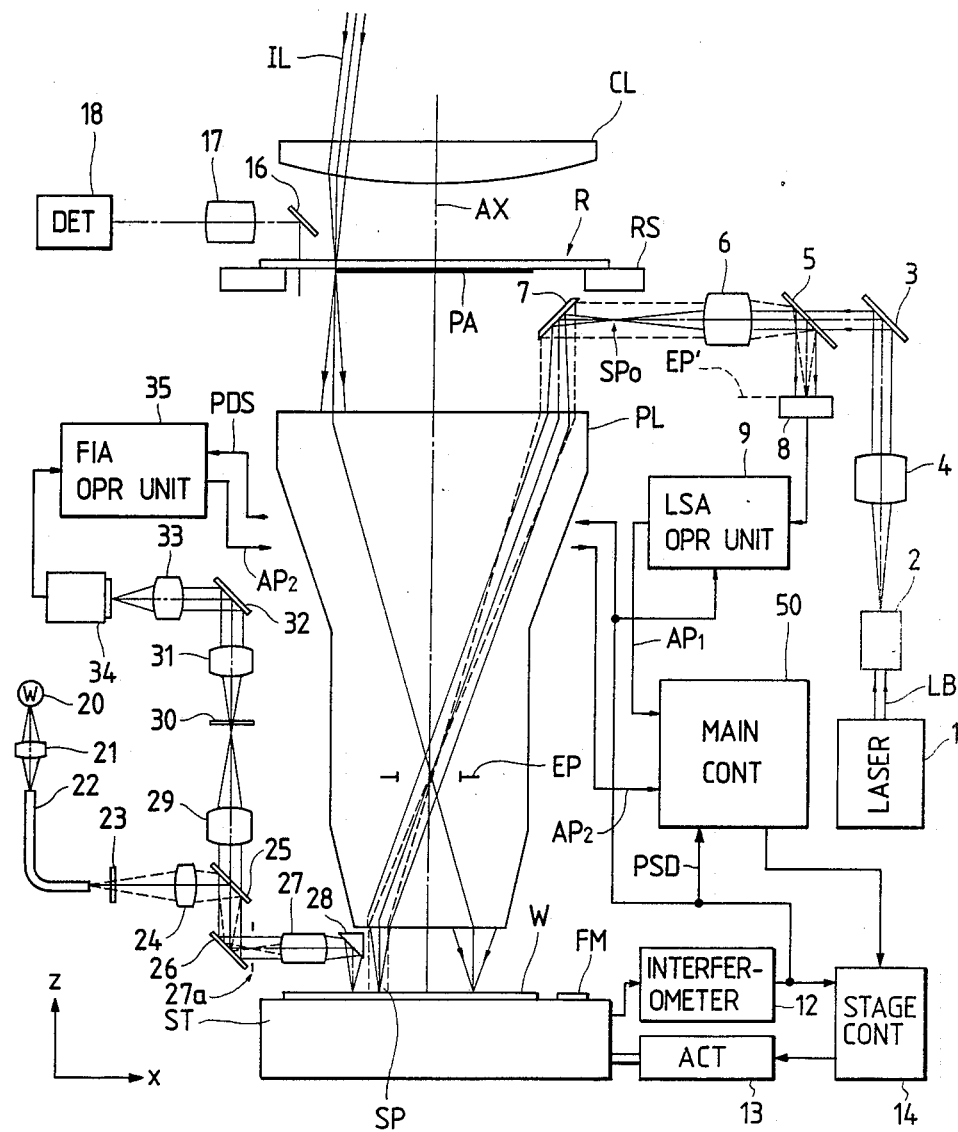
FIG. 1A is a schematic representation of a projecting type exposure apparatus as an embodiment as a first embodiment of the invention.

FIG. 1A shows a light-projecting exposure apparatus and an alignment system assembled therein embodying the invention. Illuminating light IL for exposure (e.g., g- or i-rays from a mercury lamp or ultraviolet pulse light from an exymalerser) is transmitted through a condenser lens CL to illuminate a pattern area PA on a reticle R with a uniform intensity distribution. Illumination light IL transmitted through the pattern area PA is incident on a double-side or single-side telecentric projecting lens PL, for instance, to reach a wafer W. The projecting lens PL is best aberration-corrected with respect to the wavelength of the illumination light IL, and the reticle R and wafer W are conjugate with each other for this wavelength. The illumination light IL is also Koehler illumination and is focused as light source image at the center of the eye pupil EP of the projecting lens PL. The reticle R is supported on a reticle stage RS capable of two-dimensional fine movement, and it is aligned with respective to an axis AX of the projecting lens PL with detection of reticle alignment marks formed along its edge by a reticle alignment system including a mirror 16, an objective lens 17 and a mark detection system 18. The wafer W is supported on a wafer stage ST, which is driven for two-dimensional movement by a drive system 13. The coordinates of the wafer state ST are measured instantaneously by an interferometer 12. A stage controller 14 controls the movement and alignment of the wafer stage ST by controlling the drive system 13 according to measured coordinate data from the interferometer 12. The wafer stage ST has a reference mark FM which is used in baseline measurement to be described later.

In this embodiment, a TTL system optical system for alignment is provided as first mark position detection means. More specifically, a laser 1 provides a laser beam, which is red light of a He-Ne laser or the like, and to which a photoresist layer on wafer is insensitive. The beam LB is transmitted through an optical system 2 as beam shaper and is led by a lens system 4, a mirror 3 and a beam splitter 5 to be incident on an objective lens 6. Beam LS emerging from the objective lens 6 is reflected by a mirror 7, which is disposed below and at an angle of 45 to the reticle R, to be incident on an edge portion of the field of view of the projecting lens PL as a beam parallel to the axis AX. The beam LS then passes through the center of the eye pupil EP of the projecting lens PL and illuminates the wafer perpendicularly. The optical system 2 as beam shaper converges the beam BL to from a slit-like beam spot SP0 in a space in an optical path between the objective lens 6 and projecting lens PL. The projecting lens PL re-focuses the beam spot SP0 as a spot SP on the wafer W. The mirror 7 is held in a fixed position such that it is found outside the edge of the pattern area PA on the reticle but within the field of view of the projecting lens PL. Thus, the slit-like beam spot SP formed on the wafer W is found outside the projected image of the pattern area PA. For detecting marks on the wafer W with the beam spot SP the wafer stage ST is moved horizontally relative to the spot SP. As the spot SP scans marks, regular reflected light, scattered light and diffracted light are produced from the marks, and the intensity of light is varied according to the position of the spot SP relative to the marks. These light data trace the optical path of beam projection backwards and is led by the projecting lens PL, mirror 7 to be reflected by the beam splitter 5 and reach a light-receiving element 8. The light-receiving element 8 has a light-receiving surface, which is found in a plane EP' substantially conjugate with the eye pupil EP of the projecting lens PL and has an insensitive area to the regular reflected light from marks so that it receives only scattered and diffracted light.

Figures 2A, 2B, 2C:
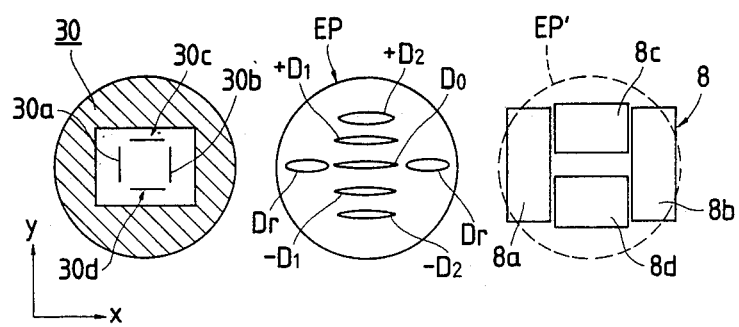
FIGS. 2A to 2C are views showing structures of various parts of the apparatus shown in FIG. 1A.

FIG. 2B shows distribution on the eye pupil EP (or eye pupil image plane EP') of light data from the marks on the wafer W. The light data includes slit-like regularly reflected light data D0 extending in the x-axis direction past the center of eye pupil EP, primary and secondary positive diffracted light data +D1 and +D2 found above the data D0 in the y-axis direction, primary and secondary negative diffracted light data −D1 and −D2 found below the data D0 and scattered light data Dr from mark edges found on the left and right sides (in the x-axis direction) of the data D0. This data pattern is described in detail in the U.S. Pat. No. 4,655,598 noted before, so it is not described here in detail. However, the diffracted light data D1 and D2 are produced only when the scanned marks are diffraction grating marks. FIG. 2C illustrates the light-receiving element 8. As is shown, it has four independing light-receiving surfaces 8a to 8d which are found in the eye pupil image plane EP' and arranged such that the light-receiving surfaces 8a and 8b receive scattered light data Dr while the light-receiving surface 8c and 8d receive diffracted light data D1 and D2. Where the wafer side numerical aperture (NA) of the projecting lens PL is large while tertiary diffracted light generated from diffraction grating mark passes through the eye pupil EP, the light-receiving surfaces 8c and 8d may be as large as to receive the tertiary diffracted light as well. Photoelectric signals from the light-receiving element 8 are coupled together with measured position data signal PDS from the interferometer 12 to a LSA (laser step alignment) operational unit 9 to produce mark position data AP1. The LSA operational unit 9 samples, according to position data signal PDS, the waveform of photoelectric signal produced from the light-receiving element 8 when the marks are scanned by the beam spot SP, and stores and analyzes the sampled waveform. By so doing, it provides data AP1 as coordinate position of the wafer stage ST when the mark center and beam spot center coincide.

The laser 1, optical system 2 as beam shaper, mirrors 3a and 3b, lens system 4, beam splitter 6, objective lens 6, mirror 7, light-receiving element 8, LSA operational unit 9 and projecting lens PL constitute the first mark position detection means for detecting the positions of marks on the wafer W. In FIG. 1A, the solid lines shown in the optical path of the TTL system optical system for alignment indicate image-focusing relation to the wafer W, while the dashed lines indicate conjugate relation to the eye pupil EP.

Now, an off-axis system alignment system as the second mark position detection means will be described.

Light generated from a halogen lamp 20 is converged by a condenser lens 21 on one end face of an optical fiber 22. Light transmitted through and emerging from the other end of the optical fiber 22 is transmitted through a filter 23, which cuts a wavelength range, to which the photoresist layer is sensitive (short wavelength range), and also infrared wavelength range, and coupled through a lens system 24 to a half mirror 25.

Light reflected by the half mirror 25 is reflected by a mirror 26 to become a substantially horizontal light beam. This light beam is transmitted through an objective lens 27 and then reflected by a prism (i.e., mirror) 28, which is held at a fixed position near the bottom of the frame of the projecting lens PL such as not to block the field of view of the projecting lens PL. The light beam from the prism 28 illuminates the wafer W perpendicularly. An adequate illumination field stop (not shown) is disposed in the optical path from the light emission end of the optical fiber to the objective lens 27 and such that it is conjugate with the wafer W with respect to the objective lens 27. The objective lens 27 is a telecentric system. On a plane 27a of its aperture stop (same as eye pupil) is formed an image of the light emission end of the optical fiber 22, thus providing Keohler illumination. Its axis is set such that the light beam from it is perpendicularly incident on the wafer W lest deviation from mark position should be produced due to turning of optical axis at the time of mark detection.

Reflected light from the wafer W is led by the prism 28, objective lens 27, mirror 26 and half mirror 25 and focused by a lens system 29 on an index plate 30. The index member 30 is disposed in a conjugate relation to the wafer W as provided by the objective lens 27 and lens system 29. As shown in FIG. 2A, it has a rectangular transparent window, in which are provided linear index marks 30a to 30d extending in the x- and y-axis directions. An image of mark on the wafer W is thus focused on the transparent window of the index plate 30, and this wafer mark image and index marks 30a to 30d are led by a relay system 31, a mirror 32 and a relay system 33 to be focused on an image sensor 34. e.g., a CCD camera. The image pick-up element 34 provides a video signal, which is coupled together with the position data signal PDS from the interferometer 12 to a FIA (field image alignment) operational unit 35. The FIA operational unit 35 determines from the waveform of the video signal a deviation of the wafer mark image from the index marks 30a to 30d and produces, from the position of the water stage ST represented by the position data signal PDS, data AP2 concerning the mark center position of wafer stage SP detected when the wafer mark image is accurately located at the center of the index marks 30a to 30d.

In the above construction, illumination light having passed through the filter 23 illuminates a local area on wafer W including a mark (smaller than a shot area) with substantially a uniform intensity of illumination, and its wavelength range is set to be approximately 200 nm.

The components from the halogen lamp 20 to the FIA operational unit in the order of reference numerals constitute the second mark position detection means. The telecentric focusing system constituted by the objective lens 27, lens system 29 and relay systems 31 and 33, through which system light having a wavelength range of approximately 200 nm, should of course be provided with corresponding chromatic aberration correction. This may be attained by utilizing the achromatic technique for telescopic lenses.

Further, the wafer side numerical aperture (NA) of the projecting lens 27 is suitably smaller than NA of the projecting lens PL. This is so in the light of the fact that the objective lens 27 and lens system 29 provide a comparatively large magnification and nevertheless require chromatic aberration correction. More specifically, when the NA of the objective lens 27 is equal to or greater than that of a usual projecting lens, i.e., about 0.45 to 0.5, it is possible with the above NA setting to avoid increase of the size of the objective lens 27 while ensuring a certain operating distance of the objective lens (to the wafer surface). In the instant embodiment, the prism 28 causes the observation field of view of the objective lens 27 to get into the bottom of the frame of the projecting lens PL and approximate the field of view of the projecting lens PL as much as possible. Usually a contracting exposure apparatus of this type is provided with a focus sensor for accurately detecting a deviation between the focal plane of the projecting lens PL and surface of the wafer W and also with a leveling sensor for detecting the tilting of the surface of short area on the wafer W and focal plane of the projecting lens PL relative to each other. The focus and level sensors effect focusing and leveling, respectively, by obliquely projecting an outer-infrared light beam on a portion of the wafer W, in which the field of view of the projecting lens PL is found, and determining a deviation of the position, at which the reflected light beam is received. From the consideration of the throughput, when observing a mark on the wafer W through the objective lens 27, focusing (i.e., vertical movement of a Z stage assembled in the wafer state ST) by operation of the focus sensor is suitably done when the mark on the wafer W is brought into the field of view of the objective lens 27. However, since the area, in which the focus sensor is detecting the surface of the wafer W, and the field of view of the objective lens 27 are deviated from each other, accurate focusing can not be obtained concerning the large NA objective lens 27 if there is a slight depressed or raised portion or warping of the wafer W between the two noted above. However, when the NA of the objective lens 27 is set to be about ½ to ⅔ of that of the projecting lens, the practical focal depth can be increased to permit observation of mark without being substantially influenced by slight depressed or raised portion or warping of wafer. In addition, to reduce the NA is advantageous in that the image quality is never suddenly changed in local portions of the field of view (for instance the center and at four corners) even with possible slight sacrifice in the perpendicularness of the axis of the objective lens with respect to the wafer W, i.e., so-called telecentricity.

While FIG. 1A shows only a single TTL system alignment system (constituted by components 1 to 8), actually another identical system is provided in a plane perpendicular to the plane of paper, and a like beam spot is formed in the projected image plane. These two beam spots have their longitudinal center lines extending toward the axis AX.

Further, since the detection center of the off-axis system alignment system (i.e., center of the index plate 30) is spaced apart from the center of the projecting lens, the disposition is done with respect to a line connecting the measuring position of the interferometer 12 and center of the projecting lens or measuring axis (i.e., center line of measuring beam) for minimizing the Abbe error (i.e., angular deviation due to inclination of the wafer stage). While only a single alignment system is shown, actually an alignment system is provided on each of x- and y-axes of measurement as shown in the U.S. Pat. No. 4,385,838.

However, where the alignment systems can not be disposed on the axes of measurement due to problems in the disposition of the optical system or where only a single optical system is used for mark observation in both the x- and y-axis directions, the Abbe error is considerable, and it is difficult to obtain sufficient accuracy. In such a case, resort may be had to a yawing sensor for measuring a yawing of the wafer stage ST (i.e., a slight rotational angle in the x-y plane of the stage), the yawing sensor being mounted on the stage for removing the Abbe error at the time of alignment by operation for correction. In other words, the mark detection position in the direction, in which the Abbe error occurs, may be corrected according to the extent of yawing of the wafer stage ST. Further, when executing alignment it is necessary to perform both groval and fine alignments for combining wafer and ensuring high accuracy of alignment, respectively. The groval alignment may be effected by a method, which combines both the TTL and off-axis alignment systems as disclosed in the U.S. Pat. No. 4,677,301. The system according to the invention usually adopts a sequence of performing a groval alignment by detecting three or two marks on wafer with a TTL alignment system having a high processing speed. However, there is sometimes a case when normal alignment fails to be obtained (particularly satisfactory mark detection fails to be obtained) depending on the thickness and kind of the wafer ground layer and photoresist layer. Therefore, sequence switching means is provided to permit execution of the groval alignment by using an off-axis system optical system using wide wavelength illumination light. In this case, the sequence is switched by judging the mark detection time and magnitude and distortion of mark detection signal when the groval alignment is executed with the TTL system alignment system.

Figure 1B:
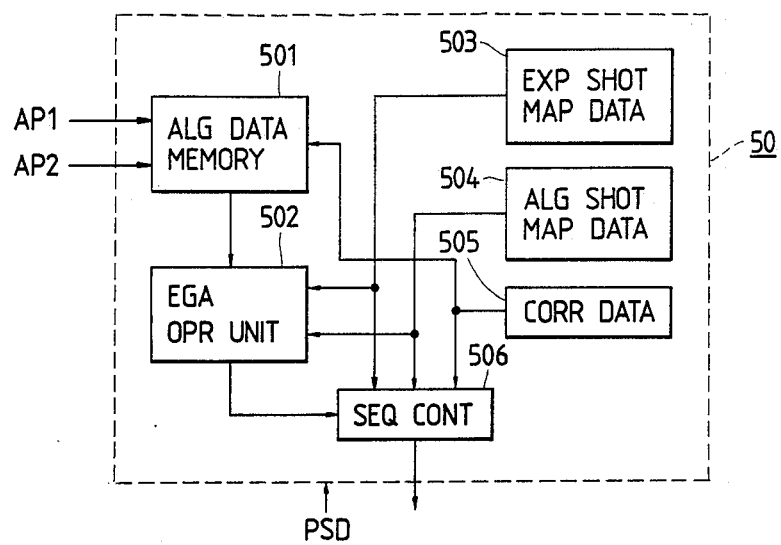
FIG. 1B is a block diagram showing a main control system.

Now, a main control system for collectively controlling the TTL system alignment system, off-axis system alignment system, stage controller 14, etc. will be described with reference to FIG. 1B.

It is assumed that the main control system 50 is receiving position data PDS from the interferometer 12 at all time. An ALG data memory 501 can receive both the mark position data AP1 and AP2 from the respective LSA and FLA operational units 9 and 35.

An EGA (enhancement groval alignment) operational unit 502 calculates actual coordinates of a shot map on water by a statistical operational process from mark position data stored in the ALG data memory 501, and it supplies its calculation result to a sequence controller 506. Details in this connection are described in the U.S. Pat. No. 4,780,617. An EXP (exposure) shot map data memory 503 stores design values of coordinates of the shot map, to be exposed, on the wafer. The design values are supplied to the EGA operational unit 506 and a sequence controller 506. The ALG shot map data memory 504 stores the shot map coordinates (design values) for alignment on the wafer. The coordinates are supplied to the EGA operational unit 502 and sequence controller 506. In a correction data memory 505 are stored various data for alignment or data for alignment correction with respect to shots for exposure. These collection data are supplied to the ALG data memory 501 and sequence controller 506. According to the various data noted above, the sequence controller 506 determines a sequence of control of the movement of the wafer stage ST at the time of alignment and also at the time of exposure in the step-and-repeat system.

The operation of the main control system 50 will be described later in detail.

Figure 3:
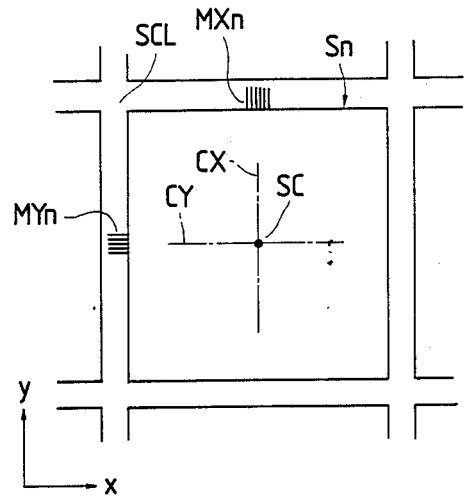

FIG. 3 shows a positional relation between a shot area Sn and alignment marks MXn and MYn on wafer W. The four sides of the shot area Sn are surrounded by scribe lines SCL. The marks MXn and MYn are formed in central portions of two perpendicular sides of the scribe lines SCL. Designated at SC is the center of the shot area Sn. The axis AX of the projecting lens PL passes through the center SC at the time of exposure. The marks MXn and MYn are located on respective lines CX and CY passing through the center SC as origin a and extending in the respective x- and y-axis directions. The mark MXn is used for position detection in the x-axis direction, while the mark MYn is used for position detection in the y-axis direction. These marks are each a multiple mark having a pattern consisting of a plurality of parallel stripes.

Figure 4:
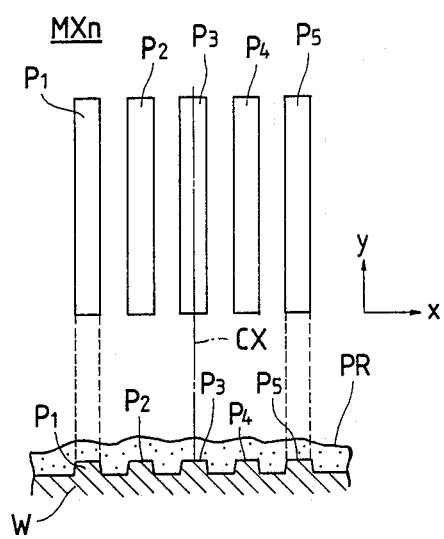
FIG. 4 is a view showing a plan view and a sectional view of mark on wafer.

FIG. 4 shows the mark MXn to an enlarged scale. As is shown, the mark MXn consists of five pattern stripes P1 to P5 extending in the y-axis direction and arranged substantially at a constant pitch in the x-axis direction. As shown in the x-axis direction sectional structure of the mark MXn, the five pattern stripes P1 to P5 are raised from the surface of the wafer W and covered by a photoresist layer PR. As shown in FIG. 3, a line CX passing through the center SC of the shot area Sn and extending in the y-axis direction coincides with the width direction center line of the central pattern stripe P3 of the mark MXn. The mark MYn, like the mark MXn, consists of five pattern stripes, with the center line of the central pattern stripe coinciding with line CY.

In this embodiment, the marks MXn and MYx are detected commonly by the alignment systems of the TTL and off-axis systems.

Figure 5:
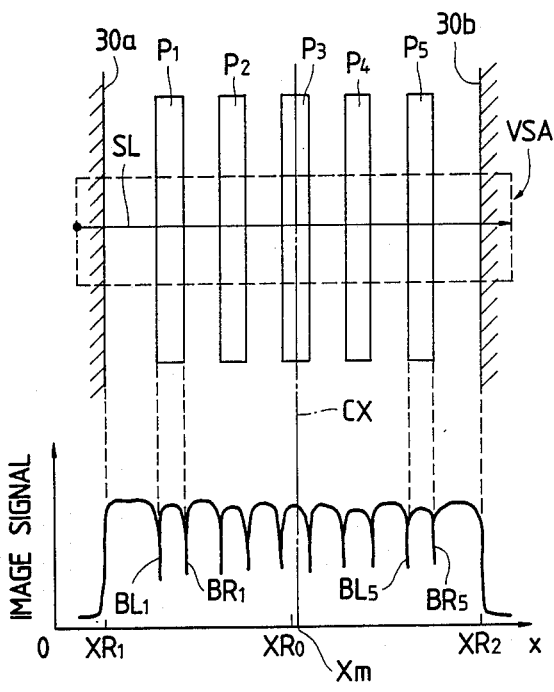
FIG. 5 is a view showing the relation between mark detection with an off-axis system alignment system and video signal.

FIG. 5 shows the mark MXn when detected by the image sensor 34 of the off-axis system alignment system and a video signal waveform at that time. The mark MXn to be detected is positioned between the index marks 30a and 30b of the index plate 30, and accurate position XA of the wafer stage ST at this time is obtained. The image sensor 34 electrically scans the images of the five pattern stripes P1 to P5 of the mark MXn and index marks 30a and 30b along scanning line SL. In this case, if the scanning is done along only a single scanning line, it is unsatisfactory in view of the signal-to-noise ratio. Therefore, levels of video signals obtained by scanning along a plurality of horizontal scanning lines covered in a video sampling area VSA shown by the dashed rectangle may be averaged for each picture element in the horizontal direction. The video signal obtained has rising and falling waveform positions corresponding to the respective index marks 30a and 30b. The positions XR1 and XR2 of these waveform portions (i.e., positions on picture element) and also mid point position XR0 therebetween are obtained.

Meanwhile, since the image sensor 34 photoelectrically detects a bright field image of the mark MXn, light returning to the objective lens 27 is extremely reduced at the left and right edges of each of the five pattern stripes P1 to P5 due to scattering of light. Therefore, the reproduction of each of the left and right edges of the pattern stripes P1 to P5 is just like a black line, that is, the video signal waveform has bottoms BL1, BR1, . . . , BL5, BR5 corresponding to the left and right pattern stripe edges.

The FIA operational unit 35 calculates from this waveform the position Xm of the center (i.e., line CX) of the mark MXn (i.e., pattern stripes P1 to P5) in the x-axis direction. More specifically, the FIA operational unit 35 calculates the center positions of the pattern stripes P1 to P5 from the left and right edge positions (i.e., bottom positions BLn and BRn), then adds these center positions and divides the sum by 5, whereby the mark position, i.e., center position of mark, in the x-axis direction can be detected.

The FIA operational unit 35 then calculates the difference X=XR0−Xm between the previously obtained position XR0 and detected mark position Xm and provides the sum of the position XA of the wafer state ST when aligned and difference X as mark position data AP2.

Figure 6:
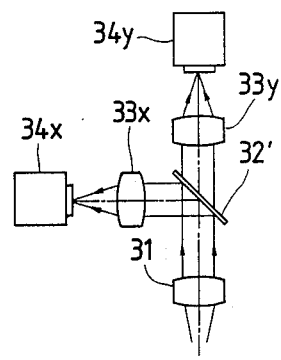
FIG. 6 is a view showing an off-axis system alignment system with two image sensors.

In FIG. 1, only a single image sensor 34 is shown. With a solid state image sensor such as CCD it is possible to provide the same picture element density in the horizontal and vertical scanning directions. Generally, however, it is simple to obtain a video signal concerning the horizontal scanning direction and process the obtained signal. Accordingly, as shown in FIG. 6 the optical path from the release lens 31 after the indication plate 30 to the image sensor is divided by a beam splitter or switching (movable) mirror 32' into two branch optical paths, and release lenses 33a and 33y and image sensors 34x and 34y for detecting the marks MXn and MYx, respectively, together with the index parks 30a and 30b are provided in the respective branch optical paths, the horizontal scanning directions of the image sensors 34x and 34y being perpendicular to each other. With this arrangement, the marks MXn and MYn can be detected with the same resolution. Of course it is possible, however, to produce video signal waveforms corresponding to the marks MXn and MYn from horizontal and vertical scanning lines using a single image sensor. Further, in the case of using a single image sensor, an image rotator may be provided in the optical path subsequent to the index plate 30 for rotating the images of MXn and MYn by 90 relative to each other.

Figure 7:
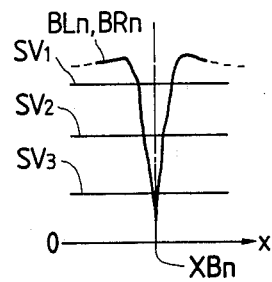
FIG. 7 is a view showing a manner of detection of bottoms of video signal.

The FIA operational unit 35 further includes a circuit for binarizing video signal at a predetermined slice level for each picture element for high speed detection of the bottoms BLn and BRn of the video signal waveforms corresponding to the marks MXn and MYn. For example, one of slice levels SV1 to SV3 as shown in FIG. 7 is used to determine the bottom positions XBn in the scanning direction (i.e., x- or y-axis direction) in the form of binary modification. The slice levels SV1 to SV3 are set for upper, intermediate and lower portions of the bottom waveform, respectively. One of these slice levels is selected experimentarily depending on the wafer process, wafer ground, etc.

Figure 8:
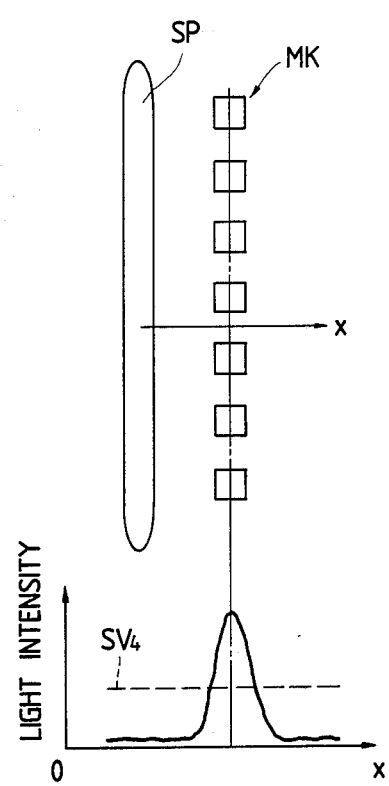
FIG. 8 is a view showing the relation between prior art scanning of diffraction grating mark with beam spot and photoelectric signal waveform.

The way of mark detection with the beam spot SP of the alignment system of the TTL system will now be described with reference to FIGS. 8 and 9. FIG. 8 shows a positional relation between a conventional diffraction grating mark MK provided for a shot area Sn on wafer and beam spot SP and also an intensity distribution of diffracted light at the time of scanning of the beam spot SP extending in the y-axis direction and mark MK relative to each other in the x-axis direction. The diffraction grating mark MK consists of a plurality of small rectangular pattern pieces (either raised or depressed) formed with a duty ratio of 1:1 and at a constant pitch in the y-axis direction. The width of the mark MK in the x-axis direction is set to be substantially equal to the width of the beam spot SP. When the spot SP overlaps the mark MK, higher order diffracted light is generated with a predetermined diffraction angle in a plane perpendicular to the plane of paper and expanding in the y-axis direction according to the wavelength and grating constant of the spot. This diffracted light is generated when there is a periodic structure pattern with step edges occurring at a predetermined pitch in the longitudinal direction of the spot SP in an area, in which the spot SP is formed. A very satisfactory signal-to-noise ratio thus can be obtained. Thus, a photoelectric signal obtained form the diffracted light has a waveform similar to an intensity distribution of the spot SP in the width direction thereof (for instance Gauss distribution), and it is possible to determine the mark center position in the x-axis direction by binarizing the waveform with a suitable slice level SV4. However, since very small rectangular pattern pieces are used as grating element, deformation due to wafer process is liable.

Figure 9:
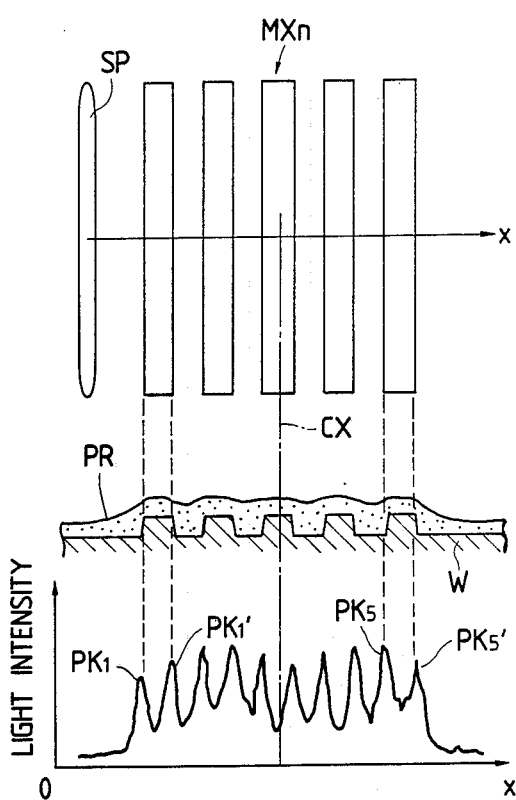
FIG. 9 is a view showing the relation between scanning of mark shown in FIGS. 4A and 4B with beam spot and photoelectric signal waveform.

In the case of scanning the multiple mark MXn with slit-like beam spot SP as shown in FIG. 9, unlike the case of the diffraction grating, photoelectric detection is made of scattered light produced at the left and right edges of the pattern stripes extending in the y-axis direction. In this case, the width of the spot SP in the x-axis direction is smaller than, for instance, no greater than ½ of, the width of the pattern stripes. The multiple mark MXn (as well as mark MYn) is used such as to detect the edges of the pattern stripes extending parallel to the longitudinal direction of the spot SP, and thus scattered light generation is smoothed (or averaged) in the direction of extension of the edges (i.e., y-axis direction). Scattered light from the pattern stripe edges from peaks PK1, PK1', . . . , PK5, PK5' on the opposite sides of the individual pattern stripes, so that the center position of the mark MYn can be determined by averaging the positions of the waveform peaks PKn and PKn in the a-axis direction. However, in such a system for detecting edge-scattered light, since the spot SP is of a laser beam (of a single wavelength), scattered light is generated in non-uniform directions due to thickness irregularities of the photoresist layer PR in the neighborhood of the pattern stripe edges. In addition, because of the single wavelength the intensity of the received scattered light is apparently greatly varied due to interference (thin film interference) of the photoresist layer PR. Therefore, the waveform is not neatly aligned but is rather complicated at the individual peaks. The processing of such waveform is not so simple but is not so difficult. A problem with such a waveform is that the position of generation of edge-scattered light is subject to shift in the measuring direction due to influence of thickness irregularities of the photoresist layer. This will cause a great error in the determination of the center position of the mark MXn. In most cases, such error is produced by interference stemming form the fact that the spot SP is of a single wavelength. In other words, if illumination light having a wide band wavelength distribution as shown in FIG. 5 is used, no interference with photoresist layer is produced, and scattered and regularly reflected light is generated very mildly from the stepped edges.

The waveform of photoelectric signal obtained when the mark MXn (or MYn) is scanned with the spot SP may not be distorted unlike the case of FIG. 9 and may be comparatively neat depending on wafers of different processes. Further, even with wafers of the same process the waveform may vary with the individual wafers depending on the photoresist layer thickness control. Further, waveform variation may occur between a central portion and an edge portion of a wafer.

The signal waveforms shown in FIGS. 8 and 9 are stored by digital sampling process in a waveform memory in the LSA operational unit 9 in response to every position measurement pulse from the interferometer (e.g., for every 0.02 micron).

Now, a typical alignment sequence of this embodiment will be described. The sequence will be described in connection with an EGA (enhancement groval alignment) system, which aims at both high thoroughput and high alignment accuracy. However, this system is described in detail in the U.S. Pat. No. 4,780,617, and its principles will be described only briefly.

In the EGA system, the positions of marks MXn and MYn of a plurality of (i.e., 3 to 9) shot areas Sn on wafer W are measured, and according to these measurements slight rotational error in a coordinate system, in which the stage ST of the wafer W is run, i.e., x-y coordinate prescribed by the interferometer 12, perpendicularness w of the shot map on wafer (or running of the stage ST), scaling errors Rx and Ry due to slight linear elongation and contraction of the wafer and slight positional deviations of the wafer in the x- and y-directions, i.e., parameters concerning off-set errors Ox and Oy by least square approximation. Using these parameters as agency, the coordinates of a design shot map is connected to the coordinates of the shot map to be actually exposed (i.e., stepping position coordinates of the wafer stage SP) for aligning the image of the pattern area PA of the reticle to each shot area Sn of the wafer for exposure.

Denoting the design shot map coordinates by (Dxn, Dyn) and wafer coordinates positioned by actual stepping by (Fxn, Fyn), there is a relation $$\begin{bmatrix} Fxn \\ Fyn \end{bmatrix} = A\backslash \cdot \begin{bmatrix} Dxn \\ Dyn \end{bmatrix} + O) \quad (1)$$

where $A\backslash$ and $(O)$ are called transformation matrices and approximated as $$A\backslash = \begin{bmatrix} Rx & -Rx(w+\theta) \\ Ry \cdot \theta & Ry \end{bmatrix} \quad (2)$$

$$O) = \begin{bmatrix} Ox \\ Oy \end{bmatrix} \quad (3)$$

Denoting shot area position coordinates obtained by sample alignment of the marks Mxn and Myn of a plurality of shot areas on wafer by $(\overline{Fxn}, \overline{Fyn})$, the values of individual parameters of the transformation matrices $A\backslash$ and $(O)$ are operationally determined such as to minimize the deviation between the actual coordinates (Fxn, Fyn) and measured coordinates, $(\overline{Fxn}, \overline{Fyn})$, i.e., minimize the address error (Exn, Eyn)=($\overline{Fxn}$−Fxn, $\overline{Fyn}$−Fyn). When the values of the transformation matrices $A\backslash$ and O) are determined, the stepping position (Fxn, Fyn) of the wafer stage ST may be determined using equation (1) noted above, and the wafer stage ST may be brought to that position for alignment and exposure.

The suffix n represents the number of shots on the wafer.

Considering the main control system 50 shown in FIG. 1, the design shot map coordinates (Dxn, Dyn) are stored in the EXP shot map data memory 503, the shot area coordinates (design values) for obtaining the measured values $(\overline{Fxn}, \overline{Fyn})$ are stored in the ALG shot map data memory 504, and the equations (1) to (3) and equations of least square approximation for determining the transformation matrices $A\backslash$ and O) are stored in the EGA operational unit 502.

In the EGA system noted above, the sample alignment is heretofore done by using the sole TTL system alignment system beam spot (of single wavelength). In this case, however, erroneous mark position measurement is liable as discussed before in connection with FIG. 9. Therefore, in this embodiment the sample alignment is done also with an off-axis system alignment system using wide band illumination light. Also, of the operational parameters $\theta$, w, Rx, Ry and Ox, Oy, those which are thought to provide inferior accuracy in the measurement using spot SP of single wavelength, particularly scaling parameters Rx and Ry, are replaced with like parameters obtained by using the off-axis system alignment system.

Figure 10:
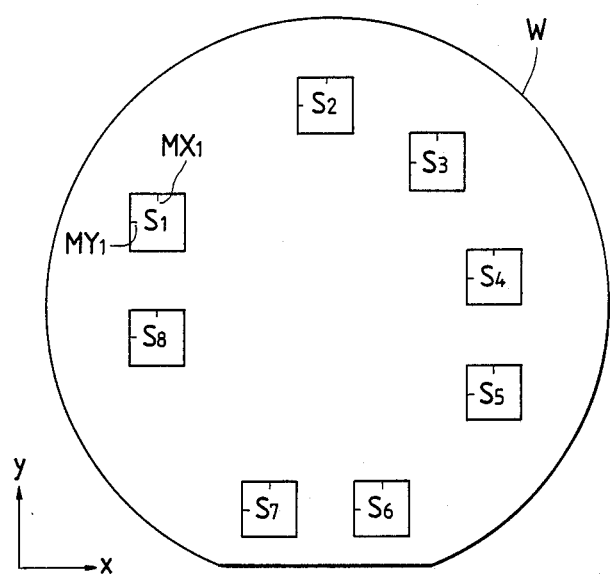
FIG. 10 is a view showing a shot area map on wafer aligned in the first embodiment.

FIG. 10 shows a map of sample alignment shot areas S1 to S8 on wafer. Marks MXn and MYn like those shown in FIG. 3 are formed in each of the shot areas S1 to S8. Although only the marks of the shot area S1 are designated by MX1 and MY1 in FIG. 10, like designation applies to the marks of the other shot areas S2 to S8. While eight sample alignment shots are shown, it is important in the EGA system that these shots are not arranged on the same line. This should be taken into due consideration particularly where the number of sample alignment shots is small, for instance 3 or 4. Further, as is obvious from FIG. 10, the coordinate values of the shots in the x- and y-axis directions do not overlap as much as possible. For example, in the case of FIG. 10, only the shot S8 has its x-coordinate coincident with that of the shot S1, but there is no coincident y-coordinate.

The coordinates of the shot areas S1 to S8 are stored in the ALK shot map data memory 504. After the wafer W is set by coarse alignment (for instance with an allowance of 2 microns) on the wafer stage ST, the sequence controller 506 receives the coordinate data of the sample alignment shot areas S1 to S8 from the ALG shot map data memory 504, and according to these coordinate data it moves the wafer stage ST successively to positions of scan of the marks MXn and MYn by the spot SP. In a normal alignment mode, the mark MXn of the shot area S1 is scanned in the x-axis direction by the spot SP extending in the y-axis direction, while the mark MY1 is scanned in the y-axis direction by the spot SP extending in the x-axis direction. This operation is performed repeatedly for the shots S1 to S8 in a clockwise excursion. Eight sets of measurement data $(\overline{Fx_1}, \overline{Fy_1})$ to $(\overline{Fx_8}, \overline{Fy_8})$ that are obtained in this way are stored as data AP1 in the ALG data memory 501.

The sequence controller 506 controls the stage controller 14 to bring the individual marks MXn and MYn of the eight shot areas S1 to S8 to a position, at which an image of the index plate 30 of the off-axis system alignment system is projected on the marks through the objective lens 27 and so forth. In this embodiment, sample alignment is executed at this time as noted before by selecting only marks, which has predominant influence on the scaling errors Rx and Ry among the parameters to be calculated in the EGA system.

The scaling errors Rx and Ry are linear elongation or contraction (of the order of ppm) of the wafer in the x- and y-axis directions. In this example, eight marks MY1, MY2, MY3, MY4, MY5, MY6, MY7 and MY8 are selected for sample alignment. More specifically, when the wafer is thought as four division areas, i.e., upper, lower, right and left division areas, for the scaling error Rx, which is elongation or contraction in the x-axis direction, only the x-axis marks MXn of the shot areas S1, S8, S4 and S5 contained in the left and right division areas are selected for sample alignment, and for the scaling error Ry as y-axis direction elongation or contraction only the y-axis marks MYn of the shot areas S2, S3, S6 and S7 contained in the upper and lower division areas are selected form sample alignment.

The mark position data for sample alignment with the off-axis system alignment system obtained in the above way are stored in advance in the ALG shot map data memory 504. Then, according to the distance or baseline amount on the wafer surface between the TTL system alignment system beam spot SP and detected center of the off-axis system alignment system (i.e., center of the index plate 30), stored in the correction data memory 505, and sample alignment position data obtained earlier by the TTL system alignment system, the sequence controller 506 successively positions the eight marks in the window of the index plate 30 and measures the positions of these marks again by determining the deviation as shown in FIG. 5. The measurements $\overline{Fy_2}$, $\overline{Fy_2}$, $\overline{Fy_3}$, $\overline{Fy_4}$, $\overline{Fy_5}$, $\overline{Fy_6}$, $\overline{Fy_8}$ and $\overline{Fx_1}$ of the positions of the eight marks obtained in the above way are supplied from the FIA operational unit 35 for storage in the ALG data memory 501.

Then, the EGA operational unit 502 determines the individual parameters using equations (2) and (3). In this embodiment, it is possible to adopt one of two different operational systems. In one of these operational systems, the parameters Rx, Ry, y, w, $\theta$, Ox and Oy are determined according to the sole result of alignment by the TTL system, and then only scaling errors Rx' and Ry' are obtained by using the result of sample alignment by the off-axis system and substituted for the scaling errors Rx and Ry determined before. In the other operational system, the substitution is done in the stage of measurements obtained as a result of sample alignment, and the parameters Rx, Ry, w, $\theta$, Ox and Oy are then determined. In the latter case, the eight sets of measured values are $(\overline{Fx_1}', \overline{Fy_1})$, $(\overline{Fx_2}, \overline{Fy_2}')$, $(\overline{Fx_3}', \overline{Fy_3})$, $(\overline{Fx_4}, \overline{Fy_4}')$, $(\overline{Fx_5}', \overline{Fy_5})$, $(\overline{Fx_6}, \overline{Fy_6}')$, $(\overline{Fx_7}, \overline{Fy_7}')$ and $(\overline{Fx_8}', \overline{Fy_8}')$. These values are used for operation in the EGA system. The operations for actually determining the individual parameters are disclosed in detail in the U.S. Pat. No. 4,780,617. In detail, with the transformation matrices A\ and O) as $$A\backslash = \begin{bmatrix} A & B \\ C & D \end{bmatrix} \quad O) = \begin{bmatrix} E \\ F \end{bmatrix}$$

and setting A=Rx, B=−Rx (w+$\theta$), C=Ry, D=Ry, E=Ox and F=Oy, $$\begin{bmatrix} \Sigma Dxn^2 & \Sigma Dxn \cdot Dyn & \Sigma Dxn \\ \Sigma Dxn \cdot Dyn & \Sigma Dyn^2 & \Sigma Dyn \\ \Sigma Dxn & \Sigma Dyn & \Sigma 1 \end{bmatrix} \begin{bmatrix} A \\ B \\ E \end{bmatrix} = \begin{bmatrix} \Sigma (\overline{Fxn} \cdot Dxn) \\ \Sigma (\overline{Fxn} \cdot Dyn) \\ \Sigma \overline{Fxn} \end{bmatrix} \quad (4)$$

$$\begin{bmatrix} \Sigma Dxn^2 & \Sigma Dxn \cdot Dyn & \Sigma Dxn \\ \Sigma Dxn \cdot Dyn & \Sigma Dyn^2 & \Sigma Dyn \\ \Sigma Dxn & \Sigma Dyn & \Sigma 1 \end{bmatrix} \begin{bmatrix} C \\ D \\ F \end{bmatrix} = \begin{bmatrix} \Sigma (\overline{Fyn} \cdot Dxn) \\ \Sigma (\overline{Fyn} \cdot Dyn) \\ \Sigma \overline{Fyn} \end{bmatrix} \quad (5)$$

Equations (4) and (5) are solved for A to F.

Then, by obtaining Rx=A, Ry=D, $\theta$=C/D, w=−B/A−C/D, Ox=E and Oy=F, the individual parameters are determined.

Regarding equations (4) and (5), there are eight summation terms including the measured values of in this embodiment, and these values are used as such when measured values are replaced.

Further, where the parameters Rx' and Ry' are determined independently from the eight measurement values obtained by the off-axis system as in the first operational system, the parameters A (Rx) and D (Ry) may be calculated using equations (4) and (5). In this case, there are four mark position measurement values $\overline{Fx_1}'$, $\overline{Fx_3}'$, $\overline{Fx_5}'$ and $\overline{Fx_8}'$ in the x-axis direction, and these values may be substituted into the right side term $\overline{Fxn}$ in equation (4). Also, there position measurement values $\overline{Fy_2}'$, $\overline{Fy_4}'$, $\overline{Fy_6}'$ and $\overline{Fy_7}'$ in the y-axis direction, and they may be substituted into the right side term $\overline{Fyn}$ in equation (5). In this way, the determined parameters A and D are substituted for the parameters measured earlier by the TTL system.

When the transformation matrices A\ and O) are calculated in the above way, these values are stored in the EGA operational unit 502. The EGA operational unit 502 calculates the position (Fxn, Fyn) of shot map for exposure using equation (1) and successively provide these values to the sequence controller 506.

In this way, the sequence controller 506 provides an instruction for stepping control of the wafer stage ST to the stage controller 14. The wafer, stage ST thus is caused to step such that the individual shot areas Sn on the wafer are successively brought into alignment with the projected image of the pattern area PA of the reticle for alignment exposure.

In this embodiment both the TTL and off-axis systems are used for one wafer. However, there are many cases where the scaling errors are substantially the same with many wafers subjected to the same process. Accordingly, where a lot of (usually 25) wafers are processed continuously, an EGA system sequence for minimizing the scaling errors using both the TTL and off-axis systems as in this embodiment is adopted for first several (for instance 3 to 5) wafers, while for the subsequent wafers averages of the scaling errors Rx and Ry determined so far are obtained and used as fixed values while adopting sample alignment using only either the TTL or off-axis system for the other parameters (Ox, Oy, $\theta$, etc.).

Further, where it is determined in advance to use both the TTL and off-axis systems, the marks MX2, MY3, MY4, MY5, MY6, MY7, MY8 and MY1 of the sample alignment shots S1 to S8 shown in FIG. 10 may be sample aligned with the TTL system alignment system for using them to determine the EGA parameters Ox, Oy, $\theta$ and w only, while sample aligning the other marks with the off-axis system alignment system for using these marks to determine the parameters Rx and Ry, that is, different marks may be used for measurements with different alignment systems. In this case, the total measurement time required for the EGA system sample alignment can be considerably reduced to suppress throughput reduction.

Figure 11:
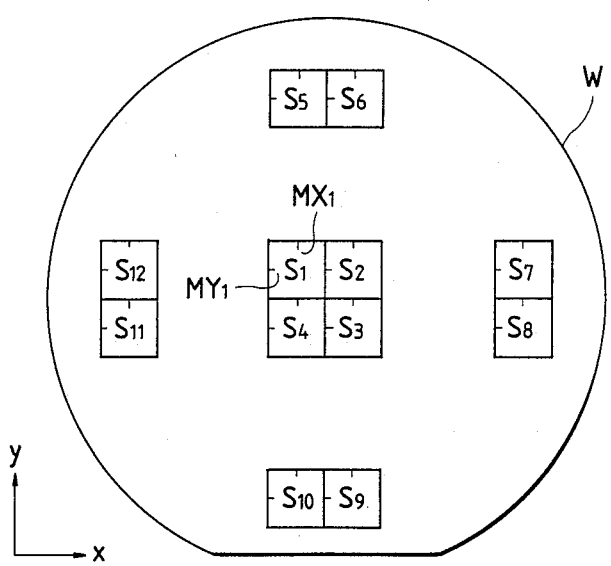
FIG. 11 is a view showing a sample alignment shot map in the second embodiment.

A second embodiment of the invention will now be described with reference to FIG. 11. This embodiment is different from the preceding first embodiment in the way of determining EGA system sample alignment shots and the way of using the alignment system.

Comparing the TTL and off-axis system alignment systems shown in FIG. 1A, generally fine variations of the distance of the spot SP from the point of projection of the pattern center of the reticle R (TTL system baseline) are often more stable than fine variations of the distance of the center of the index plate 30 (axis of the off-axis system) from the point of projection of the pattern center of the reticle R (off-axis system baseline).

Accordingly, four shots are set in a central portion of the wafer W, and two shots in each of upper, lower, left and right portions, i.e., a total of 12 sample alignment shots S1 to S12 are set. The positions of marks MX1, MY1, MX2, MY2, MX3, MY3, MX4 and MY4 of the four shot areas S1 to S4 in a central wafer portion are measured using a single wavelength beam spot of the TTL system alignment system. From the result, only the off-set errors Ox and Oy among the EGA system parameters are calculated. For the marks MX5 and MY5 to MX12 to MY12 of the remaining eight shot areas S5 to S12, their positions are measured with the off-axis system alignment system using white illumination light, and from the result of measurement the remaining EGA system parameters Rx, Ry, w and $\theta$ are calculated.

Since in this case a plurality of marks in a central wafer portion which can comparatively satisfactorily preserving the off-set errors are sample aligned with the TTL system alignment system which is stable with respect to baseline variations with respect to the reticle R, the determined parameters Ox and Oy are considerably highly accurate. Further, the parameters Rx, Ry, $\theta$ and w which are subject to errors due to interference of the photoresist layer are determined from measurement data of the marks of the shot areas S5 to S12 provided in an edge portion of the wafer W by using the alignment system of white (wide band) illumination light. Thus, the parameters Rx, Ry, w and $\theta$ can be determined highly accurately without being influenced by interference.

Figure 12:
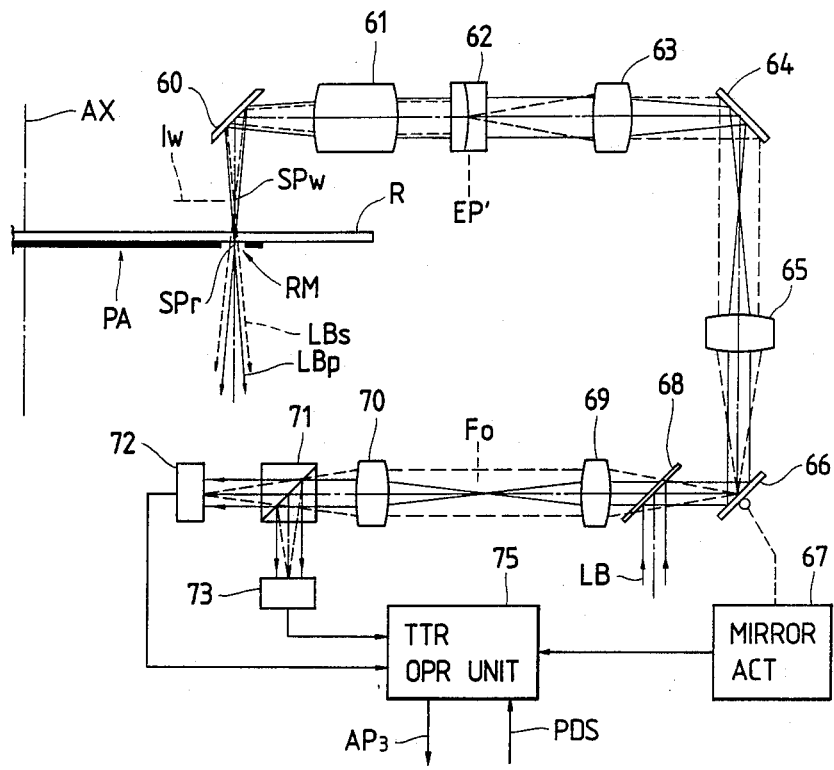
FIG. 12 is a view showing a TTR system alignment system in a third embodiment of the invention.

Now, a third embodiment of the invention will be described with reference to FIG. 12. In this embodiment, a TTR (through the reticle) system for detecting the wafer surface from above the reticle R through a projecting lens is used to scan the mark RM on reticle R and wafer mark simultaneously with a slit-like beam spot. As shown in FIG. 12, a transparent window-like mark RM is formed in an edge portion of a pattern area RA of the reticle R (corresponding to a scribe line on wafer). The optical system for alignment in this TTR system includes a whole reflection mirror 60, an objective lens 61, a dual focal point element 62, lenses 63 and 65, mirror 64, vibratory mirror 66, a mirror drive system 67, a beam splitter 68, relays 69 and 70, a polarized beam splitter 71 and light-receiving elements 72 and 73. A laser beam LB led from laser 1 and optical system 2 as beam shaper is of a longer wavelength than the exposure wavelength (for instance Ar ion laser beam) and contains two polarization components. The beam LB is reflected by the beam splitter 68, then reciprocally deflected by the vibratory mirror 66 and then led through the relay lenses 65 and 66 to be incident on the dual focal point element 62. The dual focal point element 62 is prepared by applying together a crystal, for instance rock crystal, and ordinary optical glass (which may be quartz) and provides refracting power at different levels to normal and abnormal light rays, respectively. Thus, the beam LB transmitted through the dual focal point element 62 is incident on the telecentric objective lens 61 at different angles of divergence (or convergence) due to different polarization (i.e., P- and S-polarization) components. The beam emerging horizontally from the objective lens, 61 is bent by the mirror 60 to be parallel to the axis AX of the projecting lens and perpendicularly incident on the reticle R. At this time, one of the different polarization components of the beam, for instance P-polarization beam LBp is focused as a slit-like beam spot SPr in the plane of mark RM of reticle R, while the other polarization component, for instance S-polarization beam LBs, is focused as a slit-like beam spot SPw on a plane Iw above the reticle R. The distance between the plane of mark (i.e., pattern) on the reticle R and plane Iw is determined to be equal to the extent of chromatic aberration of the projecting lens on the reticle side thereof due to the wavelength of the beam LB. In FIG. 12, solid lines indicate the beam LBp emerging from the projecting lens 61, and dashed lines indicate the beam LBs. The application interface of the dual focal point element 62, is set to coincide with the front focal plane of the objective lens 61, i.e., plane EP' conjugate with the eye pupil EP of the projecting lens PL. The beam swing origin of the vibratory mirror 66 and dual focal point element 62 (i.e., eye pupil conjugate plane EP') are set to be conjugate with each other with respect to the relay lenses 63 and 65. The beam spot SPr cans the mark RM uni-dimensionally with the action of the vibratory mirror 66, and light of scattering, regular reflection, etc. from the mark RM (i.e., edge of window) is led by the mirror 60, objective lens 61, dual focal point element 62, relay systems 63 and 65, vibratory mirror 66 and beam splitter 68 to reach the relay systems 69 and 70. Since the beam spot SPr is the P-polarization component, the light data from the mark RM is mainly of P-polarization component, and it is transmitted by substantially 100% through the polarized beam splitter 71 to reach the light-receiving element 72.

The S-polarization beam LBs transmitted through the transparent window mark RM of the reticle R is focused by the projecting lens PL as a conjugate image Pw of spot SP (i.e., spot SPw') on the wafer. The spot SPw' also scans the wafer mark uni-dimensionally with the action of the vibratory mirror 66. Light of scattering, regular reflection, etc. from the wafer mark goes back along the optical path of the beam LBs through the transparent window of the mark RM to the polarized beam splitter 71. Since the light data from the wafer mark is mainly of P-polarization component, it is reflected by substantially 100% by the polarized beam splitter 71 to reach the light-receiving element 73.

The vibratory mirror drive system 67 provides an up-down pulse signal to the TTR operational unit 75 for every unit of scanning of the spots SPr and SPw'. According to the up-down pulse signal, the TTR operational unit 75 effects digital sampling of the photoelectric signal waveforms from the light-receiving elements 72 and 73 and determines the positional deviation of the reticle mark RM and wafer mark (for instance MXn, MYn, MK) from each other according to the two signal waveforms. Then it determines the measured position of wafer mark from the positional deviation and stop position of wafer stage ST, and supplies the measured position data as data AP3 to the ALG data memory 501 shown in FIG. 1B.

Further, by permitting only the S-polarization component of the beam BL incident on the beam splitter 68 to bypass the vibratory mirror 66 and be incident on the release lens 65, it is possible to obtain entirely the same mark detection as with the TTL system alignment system shown in FIG. 1A. More particularly, only a stationary beam spot SPw (SPw') is formed, and the wafer is moved for scanning with respect to the spot SPw' for digital sampling of the photoelectric signal waveform from the light-receiving element in response to the position pulse signal PDS from the interferometer 12. In this case, the position of the wafer stage ST, at which the spot SPw' and wafer mark center coincide with each other, is supplied as data AP3 to the ALG data memory 501. In this system, the sequence is obviously the same as that in the first embodiment.

In FIG. 12, the light-receiving elements 72 and 73 are disposed such that they are conjugate with respect to the eye pupil plane EP', thus providing a light-receiving surface structure as shown in FIG. 2C.

Further, an image conjugate plane F0 is formed between the relay systems 69 and 70, and the images of the reticle mark RM and wafer mark are simultaneously focused on the plane F0.

When providing a TTR system alignment system as in this embodiment, mark position data AP3 from the TTR operational unit 75 may be used in lieu of data AP1 from the LSA operational unit 9 shown in FIG. 1A.

As has been shown, in a contracting type exposure apparatus, which incorporates the TTR system alignment system in this embodiment, it is possible to use a die-by-die alignment process, in which a shot area to be exposed and the pattern PA of the reticle R are aligned substantially in an overlapped state, and also a EGA system incorporating an off-axis system alignment system using white illumination light. Thus, it is possible to use various alignment modes freely. Further, since the dual focal point element is disposed in the eye pupil conjugate plane, an insensitive wavelength longer than the exposure wavelength can be selected for the beam LB, and also lateral deviation of the two spots SPr and SPw from each other can be substantially ignored. Further, since a wavelength subject to less absorption by the photoresist layer can be selected for the beam LB, the optical characteristics of the photoresist layer (such as reflectivity and diffraction index) are hardly changed from the instant of start of scanning of the spot SPw' over the wafer for mark detection. Thus, the mark position detection is subject to very little error due to changes in the optical characteristics of the photoresist layer.

In this case, prior to the mark detection by the die-by-die system marks belonging to several shot areas on wafer are detected with the off-axis system white illumination light alignment system, then the same marks are detected with the TTR system beam spot SPw', and the mark signal waveforms or mark positions obtained with both the detection systems are compared to determine a slight off-set error of the mark position detected with the single wavelength beam spot SPw', the off-set error being stored in the correction data memory 505 of the main control system 50. Then, when performing the die-by-die alignment with the TTR system alignment system, the wafer mark position may be corrected by an amount of error stored in the correction data memory 505. This is also applicable to the TTL system alignment system.

Figure 13:
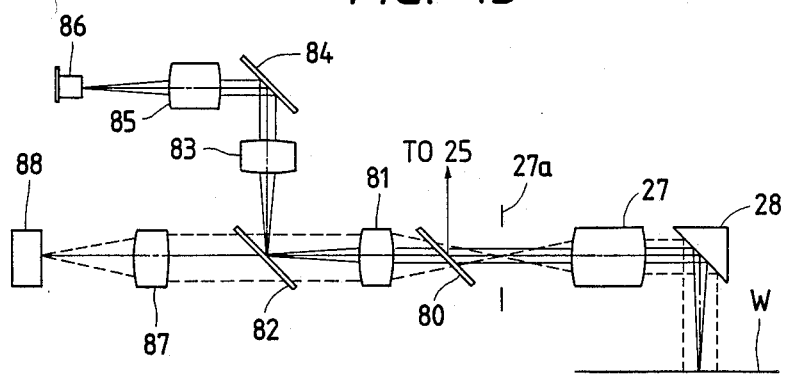
FIG. 13 is a view showing an off-axis alignment system in a fourth embodiment of the invention.

FIG. 13 shows a modification of the off-axis system alignment system as a fourth embodiment of the invention. In the case of the off-axis system alignment system shown in FIG. 1A, only image detection is shown. However, it is possible to use the objective lens 27 for projecting a laser beam on wafer as well. To this end, a beam splitter or dichroic mirror 80 is used in lieu of the mirror 26, and subsequent to the element 80 are provided a light-receiving system including a relay lens 81, a beam splitter 82, a relay lens 87 and a light-receiving element 87 and a light-emitting system including a laser 86, an optical system 85 having a cylindrical lens and serving as beam shaper, a mirror 84 and a lens system 83. The light-receiving element 87 has its light-receiving surface divided to receive regularly reflected light, diffracted light and scattered light independently. The relay systems 81 and 87 are disposed to be conjugate with each other with respect to the stop surface (front focal plane) of the objective lens 27. A laser beam from the laser 86 is led along an optical path shown by solid lines by the telecentric objective lens 27 and prism 28 to be focused as a slit-like beam spot on the wafer W.

In this embodiment, a stationary beam spot is formed on the axis of the objective lens 27. Thus, by scanning the wafer stage ST photoelectric signal waveforms corresponding to the wafer marks MXn and MYn can be obtained from the light-receiving element 88.

While illumination light is led by the mirror 80 to be incident on the objective lens 27. Where the wavelength range of the white illumination light and wavelength of the beam from the laser 86 overlap, a shutter or the like may be provided to switch either beam from the other.

This embodiment is suited as off-axis system alignment system for an extra stepper or the like, in which great restrictions are imposed on the optical performance of the projecting lens among steppers, i.e., contracting exposure apparatuses.

Further, since the mark detection position obtained with single wavelength beam spot and that of the index plate 30 obtained with white light substantially coincide, it is possible to substantially avoid throughput reduction. Of course, it is necessary to calculate in advance the distance between the spot position and position of the index marks 30a to 30d by using a reference mark FM.

In the above individual embodiments of the invention, an auto-focusing system may be provided for the off-axis system alignment system as well. In this case, however, the cost is increased. Therefore, the mark position measurement area on wafer may be focused using the auto-focusing system with respect to the projecting lens PL, and then the wafer stage ST may be fed to be under the off-axis system objective lens 27 while holding the Z stage stationary. When this is done so with the shot map as shown in FIG. 11, with two side-by-side shots provided in each of the four edge areas (for instance shots S5 and S6 and shots S7 and S8), the same focus may be set for both the shot areas, so, that the throughput is improved. In this case, however, it is necessary to make the wafer surface parallel to the image projection plane using a leveling stage. Further, where a digital micrometer or the like is assembled for accurately reading out the height of the stage in the direction of the optical axis, focusing may be done when detecting mark with a TTL or TTR system alignment system, and the height of the Z stage at this time may be stored. Then, when detecting the sam shot mark with the off-axis system alignment system, focusing may be done under open control to reproduce the stored height of the Z stage. Further, same effects may be obtained by projecting psuedo monochromatic light such as g- and i-rays, same as exposure light, in lieu of the single wavelength illumination light (spot light), on a slit plate and projecting the slit image on the wafer through the projecting lens.

Further, while in the above embodiments the alignment system using single waveform illumination light produced a slit-like light spot for mark detection, this is by no means limitative; for example, same effects may be obtained by locally illuminating a local area of wafer including mark with single wavelength illumination light, focusing the reflected light to produce a mark image and photoelectrically detecting the mark image. Further, a double diffraction grating alignment process may be utilized as a separate alignment system using single wavelength illumination light. This alignment system can be assembled in the TTL alignment system shown in FIG. 1A the TTR alignment system shown in FIG. 12 or the off-axis alignment system shown in FIG. 13, and it has a construction as shown in detail in FIG. 14.

Figure 14:
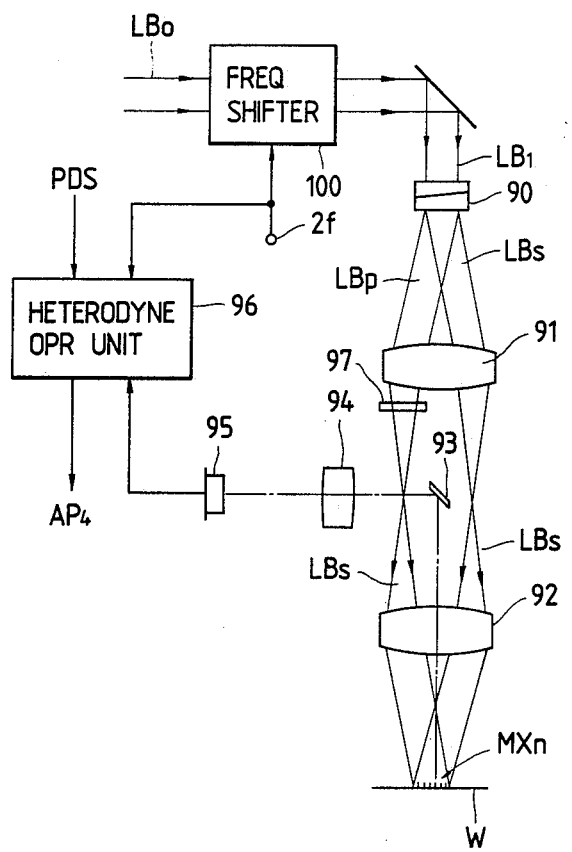
FIG. 14 is a view showing a double diffraction grating alignment system in a fifth embodiment.
Figure 15:
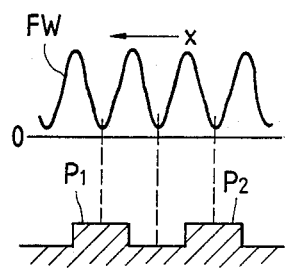
FIG. 15 is a view showing a diffraction grating and an interference fringe distribution.

FIG. 14 shows an off-axis alignment system. A parallel laser beam LB0 of single wavelength has different linear polarization components and is incident on a frequency shifter 100. The frequency shifter 100 receives a high frequency signal at a modulating frequency 2f and provides a parallel beam LB1 obtained by giving a frequency difference of 2f between two linear polarization components of the beam LB0. This beam LB1 is split by Wollaston polarizing prism 90 into beam proceeding in two different directions due to the polarization components. These beams LBs and LBp are incident on a lens system 91. The beams LBs and LBp are once converged at a position of eye pupil (stop) of the system and is then incident on the lens system 92 (corresponding to the objective lens 27 shown in FIG. 13) to simultaneously illuminate the mark MXn on the wafer W as parallel beams inclined with respect to each other. The Wollaston prism 90 is disposed conjugate with the wafer W with respect to the lens systems 91 and 92. However, since the two beams incident on the wafer in two different directions have different directions of polarization, no interference fringe is formed on the wafer. Accordingly, a member 97 for equivalently converting the polarization component of one of the two beams to that of the other is provided in the optical path of, for instance, the beam LBp for conversion to the polarization component of the other beam LBs. With this arrangement the two beams illuminating the same position of the wafer in two different directions are both S-polarization beams LBs. Thus, a uni-dimensional interference fringe is produced in the direction of row of the pattern stripes P1 to P5 of the mark MXn (in FIG. 4) on the wafer depending on the wavelength of and intersection angle between the two beams LBs. FIG. 15 shows a relation between an intensity distribution waveform FW of interference fringe and sectional shape of the pattern stripes P1 and P2 of the mark MXn. The pitch of the waveform FW in the x-axis direction is set to be just double the path of the pattern stripes P1, P2, . . . Since there is a frequency difference of 2f between the beams incident in the two different directions, the interference fringe flows at a frequency of 2f in the x-axis direction. Thus, the interference fringe illuminates the mark MXn, so that interference light is generated from the mark MXn in a substantially perpendicular direction. This light is transmitted through the lens system 92, reflected by a small mirror 93 on the axis and transmitted through the eye pupil relay system 94 to reach the light-receiving element 95. The light-receiving element 95 receives interference light sinusoidally varying in intensity at the frequency of 2f and provides a corresponding photoelectric signal to a heterodyne operational unit 100. The heterodyne operational unit 100 receives the original signal at the modulating frequency of 2f as reference signal and determines a phase difference (within 180) with respect to this reference signal. The phase difference corresponds to a positional deviation in the x-axis direction from the reference position of the mark MXn, here within ½ of the pitch of the pattern stripes P1, P2, . . . Thus, the heterodyne operational unit 100 provides accurate position data AP4 of the mark MXn according to position data PDS of the wafer state ST in the stationary state of the wafer W and positional deviation within ½ pitch. The data AP4 is supplied as result of mark position measurement with single wavelength light to the ALG data memory 501.

When assembling the construction shown in FIG. 14 in the TTL system the objective lens 6 shown in FIG. 1A is assembled as lens system 92 in the optical system such that the plane of the spot SP0 shown in FIG. 1A corresponds to the wafer surface shown in FIG. 14. When assembling the construction in the TTR system, the objective lens 61 and focal point element 62 shown in FIG. 12 may be provided in lieu of the objective lens 92 shown in FIG. 14 such that the wafer surface shown in FIG. 14 corresponds to the surface Iw in space in FIG. 12. Further, when no frequency difference is provided between two beams projected on the wafer in two different directions, a stationary interference fringe FW. In this case, the wafer is subjected to fine movement.

In the above double diffraction grating alignment process, the capability of interference with laser beam is used, so that the phenomenon of interference on the photoresist layer is obtained entirely in the same way as described before.

As has been described in the foregoing, according to the invention a plurality of alignment marks formed on a wafer are illuminated with single waveform or psuedo chromatic illumination light for mark position detection and also illuminated with a wide band illumination light also for mark position detection, and both the detection results are used to effect alignment of the wafer. Thus, it is possible to reduce the influence of the photoresist layer and obtain very high accuracy of alignment.

Further, the invention can be utilized not only for projecting type exposure apparatuses but also for exposure apparatuses of other systems, for instance proximity contact system.

I claim:

1. An exposure apparatus for transferring a mask pattern to a wafer having a surface photoresist layer sensitive to a predetermined wavelength range, comprising:

first mark position detection means for illuminating said wafer with single wavelength or quasi monochromatic light as first light, detecting a first mark on said wafer illuminated by said first light and providing first position data concerning the position of said first mark according to the result of said first mark detection;

second mark position detection means for illuminating said wafer with light having a wider wavelength distribution than said first light as second light, detecting a second mark on said wafer illuminated by said second light and providing second position data concerning the position of said second mark according to the result of said second mark detection; and position determination means for determining relative positions of said wafer and said mark according to both said first and second position data.

2. The exposure apparatus according to claim 1, wherein said exposure apparatus further comprises an optical projecting system for focusing said mask pattern on said wafer and a stage moved with said wafer supported thereon two-dimensionally along a mask pattern image projection surface of said optical projecting system to successively change in image projection position on said wafer, said first mark position detection means for photoelectrically detecting said first mark provided on each said image projection position on said wafer via said optical projecting system, and said second mark position detection means disposed at a predetermined distance from said optical projecting system for photoelectrically detecting said second mark provided at each said image projection position on said wafer.

3. The exposure apparatus according to claim 2, wherein said position determination means includes means for statistically determining the position of a map of said image projection positions on said wafer.

4. The exposure apparatus according to claim 1, wherein said marks are formed in a common mark pattern.

* * * * *